(12) United States Patent
Juskey et al.

(10) Patent No.: US 8,487,435 B2
(45) Date of Patent: Jul. 16, 2013

(54) SHEET-MOLDED CHIP-SCALE PACKAGE

(75) Inventors: Frank J. Juskey, Apoka, FL (US); Paul Bantz, Los Altos, CA (US); Otto Berger, Grafling (DE)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 13/252,083

(22) Filed: Oct. 3, 2011

(65) Prior Publication Data
US 2012/0080768 A1   Apr. 5, 2012

Related U.S. Application Data

(63) Continuation-in-part of application No. 12/207,206, filed on Sep. 9, 2008, now Pat. No. 8,030,770.

(51) Int. Cl.
*H01L 29/40* (2006.01)
*H01L 21/44* (2006.01)

(52) U.S. Cl.
USPC ........... 257/738; 257/690; 257/693; 257/723; 257/724; 257/737; 257/E21.502; 257/E23.021; 257/E23.068; 257/E23.069; 438/107; 438/127; 438/613

(58) Field of Classification Search
USPC .......... 257/737, 738, 778, E23.021, E23.069, 257/690, 693, 723, 724, E21.502, E23.038; 438/108, 612–617, 107, 127
See application file for complete search history.

(56) References Cited

U.S. PATENT DOCUMENTS

| 6,063,646 | A | 5/2000 | Okuno |
| 6,868,604 | B2 * | 3/2005 | Kresge et al. ................... 29/852 |
| 6,998,710 | B2 | 2/2006 | Kobayashi |
| 7,023,085 | B2 | 4/2006 | Pu |
| 7,122,891 | B2 | 10/2006 | Dishongh |
| 7,183,191 | B2 | 2/2007 | Kinsman |
| 7,202,107 | B2 | 4/2007 | Fuergut |
| 7,456,496 | B2 | 11/2008 | Hwee |
| 7,476,980 | B2 * | 1/2009 | Rebibis et al. ................ 257/782 |
| 7,829,380 | B2 * | 11/2010 | Irsigler et al. ................. 438/108 |
| 2008/0023810 | A1 * | 1/2008 | Yamazaki et al. ............ 257/679 |

OTHER PUBLICATIONS

Freescale Semiconductor, Redistributed Chip Package (RCP) Technology.
Gurnett, Keith, et al., "Farewell to Surface Mount," Military & Aerospace Electronics, vol. 19, No. 7, Jul. 2008.

* cited by examiner

*Primary Examiner* — Jasmine Clark
(74) *Attorney, Agent, or Firm* — Schwabe, Williamson & Wyatt, P.C.

(57) ABSTRACT

Embodiments include but are not limited to apparatuses and systems including a microelectronic device including a die having a first surface and a second surface opposite the first surface, a conductive pillar formed on the first surface of the die, and an encapsulant material encasing the die, including covering the first surface, the second surface, and at least a portion of a side surface of the conductive pillar. Methods for making the same also are described.

18 Claims, 7 Drawing Sheets

SHEET-MOLDED CHIP-SCALE PACKAGE

CROSS-REFERENCE TO RELATED APPLICATION

The present application is a continuation-in-part of U.S. patent application Ser. No. 12/207,206, filed Sep. 9, 2008, now U.S. Pat. No. 8,030,770, and entitled "Substrateless Package," the entire content and disclosure of which is incorporated herein in its entirety.

TECHNICAL FIELD

Embodiments of the present invention relate generally to microelectronic devices and more particularly to devices including dies and modules packaged without carrier substrates.

BACKGROUND

In the current state of integrated circuit technology, an integrated circuit device will often be in the form of a die or a chip. One or more die sometimes will be mounted onto a carrier substrate to form a package. Although carrier substrates may be suitable for many applications, it adds to the overall size and expense of the package.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The term "coupled to," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The term "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer. Usage of terms like "top" and "bottom" are to assist in understanding, and they are not to be construed to be limiting on the disclosure.

The term "active surface" as used herein may refer to the surface of a die having the active regions/areas, as is known to those having skill in the art. The active surface a die may include any one or more of various circuitry components, such as transistors, memory cells, passive components, and the like.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to microelectronic devices including a die having a first surface and a second surface opposite the first surface, a conductive pillar formed on the first surface of a die, and an encapsulant material, such as molding material and/or wafer-coating resin, encasing the die, including covering the first and second surfaces of the die and at least a portion of a side surface of the conductive pillar. In various embodiments, a first end of the conductive pillar may be formed on the first surface of the die, and a solder bump may be directly coupled with a second end of the conductive pillar. Accordingly, in various embodiments, the microelectronic device may be a chip-scale package or module.

Figure 1:
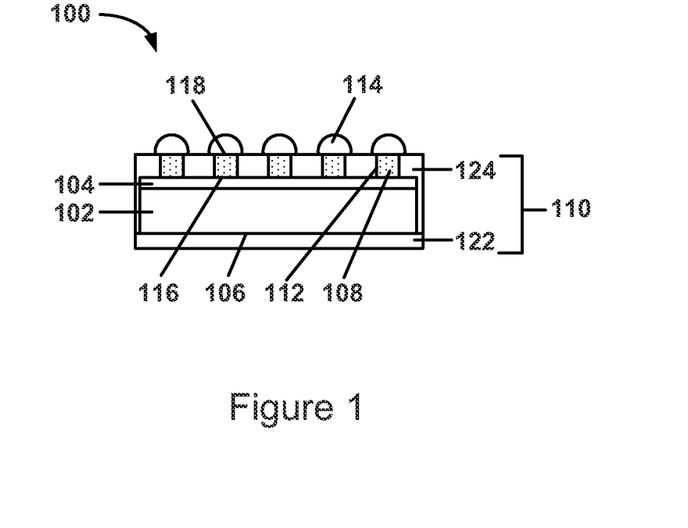
FIG. 1 illustrates a cross-sectional side view of a microelectronic device including a sheet-molded chip-scale-package having a die, conductive pillars formed on the die, and an encapsulant material encasing the die and the conductive pillars, in accordance with various embodiments of the present invention.

A cross-sectional side view of an example microelectronic device 100 is illustrated in FIG. 1. As illustrated, the microelectronic device 100 (also referred to as "device 100") includes at least one die 102 including a first surface 104 and a second surface 106 opposite the first surface 104. A plurality of conductive pillars 108 may be formed on the first surface 104, and an encapsulant material 110 such as a molding material may cover the first surface 104, the second surface 106, and at least a portion of side surfaces 112 of the conductive pillars 108, to encase the die 102 and the conductive pillars 108, to form or begin to form a chip-scale package or module.

The first surface 104 may be an active surface. Although the illustrated embodiment shows the active surface as running the entire width of the die 102, in alternate embodiments, the active surface 104 may run less than the entire width of die 102.

First ends 116 of the conductive pillars 108 may be directly coupled with the first surface 104 of the die 102, and at least the second ends 118 of the conductive pillars 108 may be free of the encapsulant material 110. Solder bumps 114 may be directly coupled with the second ends 118 of the conductive pillars 108, as shown. The solder bumps 114 may provide for electrical connection with the die 102 via the conductive pillars 108. In various embodiments, the device 100 may be coupled with a system-level board such as, for example, a printed circuit board, by reflowing the solder bumps 114.

In some embodiments, the conductive pillars 108 comprise copper. Other conductive material may be similarly suitable.

The encapsulant material 110 may be a molding material. Molding material is sometimes referred to in the art as "mold compound," and may be any electrically insulative encapsulant material known in the art suitable for the purpose. For example, the molding material may be an epoxy material. In various other embodiments, however, the molding material may be one of plastic, ceramic, glass, and the like.

Figure 2:
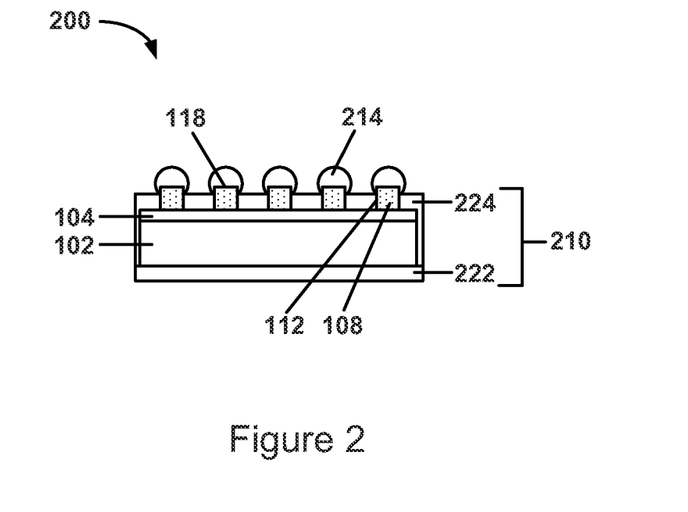
FIG. 2 illustrates a cross-sectional side view of another microelectronic device including a sheet-molded chip-scale-package having a die, conductive pillars formed on the die, and an encapsulant material encasing the die and the conductive pillars, wherein a surface of the encapsulant material is below the level of the ends of the conductive pillars, in accordance with various embodiments of the present invention.
Figure 3:
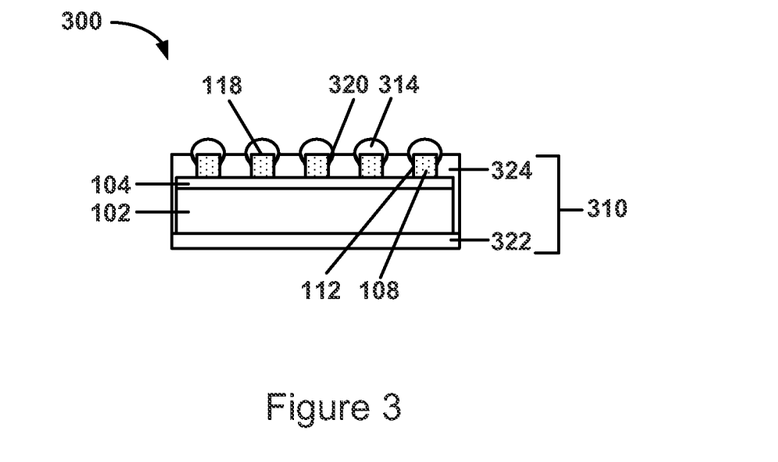
FIG. 3 illustrates a cross-sectional side view of another microelectronic device including a sheet-molded chip-scale-package having a die, conductive pillars formed on the die, and an encapsulant material encasing the die and the conductive pillars, wherein the encapsulant material includes recesses around the conductive pillars, in accordance with various embodiments of the present invention.

The encapsulant material 110 may comprise a first sheet 122 of the encapsulant material 110 on the second surface 106 of the die 102, and a second sheet 124 of the encapsulant material 110 over the first surface 104 and at least a portion of the side surfaces 112 of the conductive pillars 108, as shown in FIGS. 1-3. The first sheet 122 and the second sheet 124 together encase the die 102 and the conductive pillars 108, to form or begin to form a chip-scale package or module. It is noted that one or more operations on the device 100, whether during construction or thereafter, may result in the first sheet 122 and the second sheet 124 becoming joined such that the sheets 122, 124 are no longer distinct, or are substantially indistinct. For example, heat, vacuum, or pressure may have the effect of fusing the sheets 122, 124 together.

As illustrated in FIG. 2 and FIG. 3, portions of the side surfaces 112 of the conductive pillars 108 may be free of the encapsulant material 210 (sheets 222, 224), 310 (sheets 322, 324) such that the solder bumps 214 directly couple with those portions of the side surfaces 112. For the device 200 illustrated in FIG. 2, the surface of the second sheet 224 of the encapsulant material 210 is below the level of the second ends 118 of the conductive pillars 108 so that portions of the side surfaces 112 are free of the encapsulant material 210, allowing the solder bumps 214 to directly couple with those portions of the side surfaces 112 as shown. In other embodiments, as illustrated for the device 300 illustrated in FIG. 3, encapsulant material 310 in the area 320 around the second ends 118 of the conductive pillars 108 may be removed (by laser ablation, for example) to form recesses so that the portions of the side surfaces 112 of the conductive pillars 108 are free of the encapsulant material 310, allowing the solder bumps 314 directly couple to those portions of the side surfaces 112 as shown.

Figure 4:
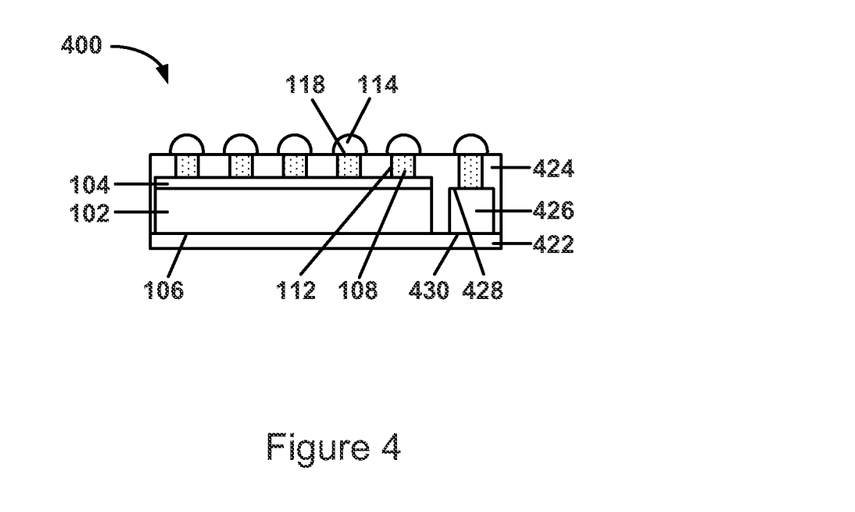
FIG. 4 illustrates a cross-sectional side view of another microelectronic device including a sheet-molded chip-scale-package having a die, another component, conductive pillars formed on the die, and an encapsulant material encasing the die, the other component, and the conductive pillars, in accordance with various embodiments of the present invention.

FIG. 4 illustrates another example of a microelectronic device 400 in accordance with various embodiments. As illustrated, the device 400 includes at least one die 102 and at least one other component 426. One or more conductive pillars 108 may be formed on the first surface 104 of the die 102 and the first surface 128 of the other component 426, and an encapsulant material 422, 424 may cover the first surfaces 104, 428, the second surfaces 106, 430 and at least a portion of the side surfaces 112 of the conductive pillars 108, to encase the die 102, the other component 426, and the conductive pillars 108, to form or begin to form a chip-scale package or module. Solder bumps 114 may be directly coupled with the second ends 118 of the conductive pillars 108, as shown.

The other component 426 may be a passive device such as, for example, a resistor, an inductor, a diode, a low pass filter, a surface acoustic wave (SAW) or bulk acoustic wave (BAW) device, or a capacitor. In some embodiments, the other component 426 may be another die.

An example method for forming a microelectronic device, such as, for example, the device 100, 200, 300, or 400 illustrated in FIGS. 1-4, respectively, is illustrated in FIGS. 5A-5H by way of cross-sectional side views of the device at various stages of the method. It should be noted that various operations discussed and/or illustrated may be generally referred to as multiple discrete operations in turn, to help in understanding embodiments of the present invention. The order of description should not be construed to imply that these operations are order dependent, unless explicitly stated. Moreover, some embodiments may include more or fewer operations than may be described.

Figure 5A:
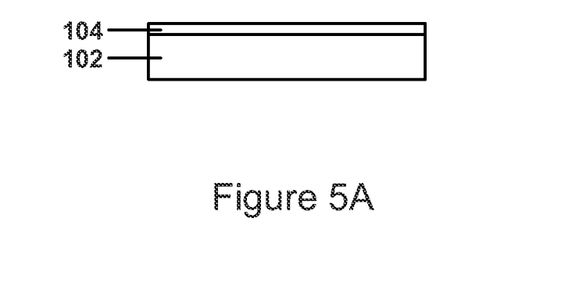
FIGS. 5A-5H illustrate various stages of a method for making a microelectronic device including a sheet-molded chip-scale-package having a die, conductive pillars formed on the die, and an encapsulant material encasing the die and the conductive pillars, in accordance with various embodiments of the present invention.

As illustrated in FIG. 5A, a die 102 including a first surface 104 is provided. The first surface 104 may be an active surface.

Figure 5B:
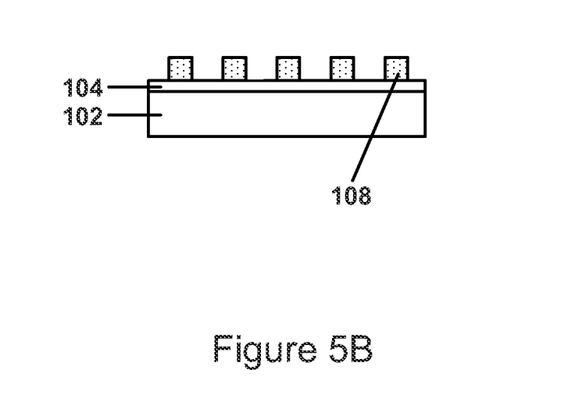

In FIG. 5B, conductive pillars 108 are formed on the first surface 104. As discussed herein, the conductive pillars 108 may comprise copper or another suitable material.

In some embodiments, an optional cap layer (not illustrated herein) may be formed on top surfaces of the conductive pillars 108. The cap layer may be removed at another stage of the method (as discussed more fully below), and thus the cap layer may be a material selected to be easily removed or removed with minimal cost. In general, the cap layer may serve to protect the conductive pillars from exposure (e.g., to minimize oxidation or damage to the top surfaces of the conductive pillars 108). Although any material, in general, may be suitable for forming the cap layer, tin may be a suitable option in some embodiments. Other material may be similarly suitable.

Figure 5C:
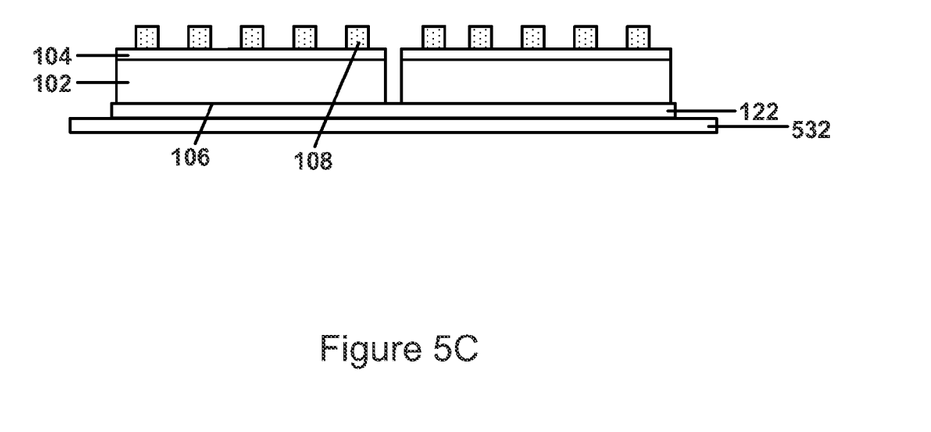

In FIG. 5C, one or more of the dies 102 may be placed onto a first sheet 122 of the encapsulant material such that a second surface 106 of the die 102 is covered by the first sheet 122.

Any suitable carrier 532 may be used for facilitating the handling of the first sheet 122 of encapsulant material and the dies 102.

Prior to placing the die 102 onto the first sheet 122, the first sheet 122 of encapsulant material may be warmed such that the encapsulant material becomes tacky, which may facilitate the adhesion of the dies 102 to the first sheet 122.

In various embodiments, rather than being a molding material, the first sheet 122 may instead be a temporary adhesive film to temporarily hold the die 102 in place during one or more subsequent operations. In these embodiments, encapsulant material may be formed on the second surface 106 of the die 102 in a subsequent operation, as discussed more fully below. The temporary adhesive film may be a thermally-releasable temporary tape that releases from the die 102 when heated above a certain temperature.

In some embodiments, at least one other component in addition to the die 102 may be provided, as described herein with reference to FIG. 4.

Figure 5D:
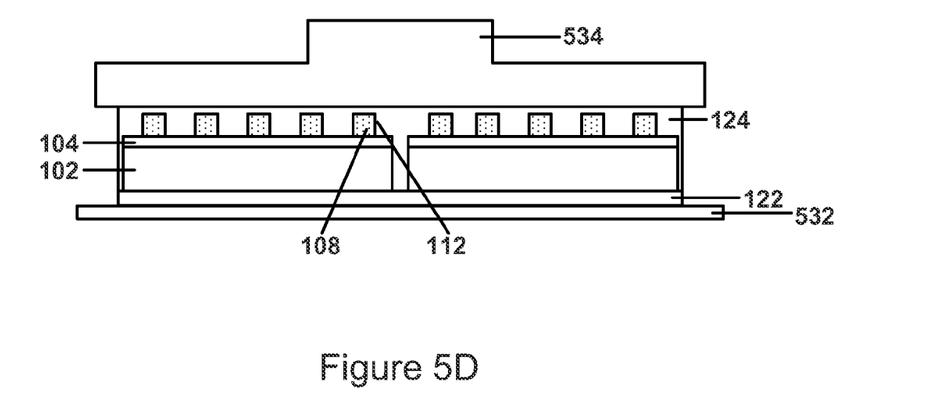

A second sheet 124 of encapsulant material may be formed over the die 102, as shown in FIG. 5D, such that the die 102 and at least a portion of the side surfaces 112 of the conductive pillars 108 are encased in the encapsulant material.

The second sheet 124 of encapsulant material may be formed over the die 102 by any suitable method including, but not limited to, lamination. As shown in FIG. 5D, a press 534 may press-laminate the second sheet 124 of encapsulant material onto the die 102. The press lamination may be performed under vacuum and/or heat, which may provide, in some embodiments, void-free or substantially-void-free lamination.

Figure 5E:
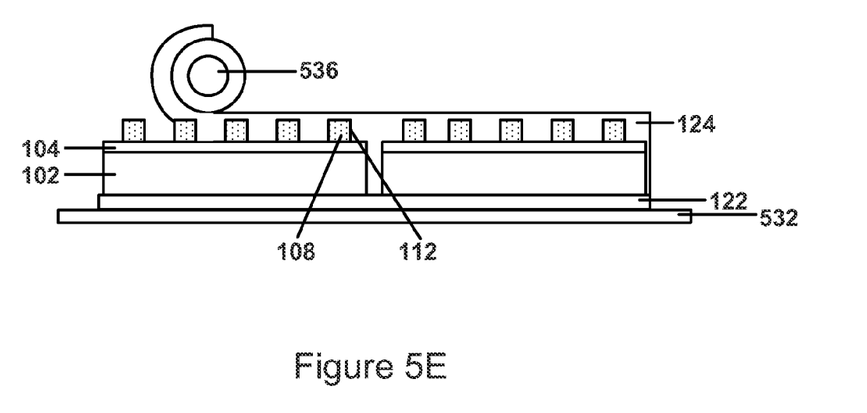

In other embodiments, the second sheet 124 may be roll-laminated by a roller 536 as shown in FIG. 5E. The roll-lamination may be performed under vacuum and/or heat, which may provide, in some embodiments, void-free or substantially-void-free lamination.

After the second sheet 124 is laminated onto the die, a curing operation may be performed to cure the encapsulant material.

Figure 5F:
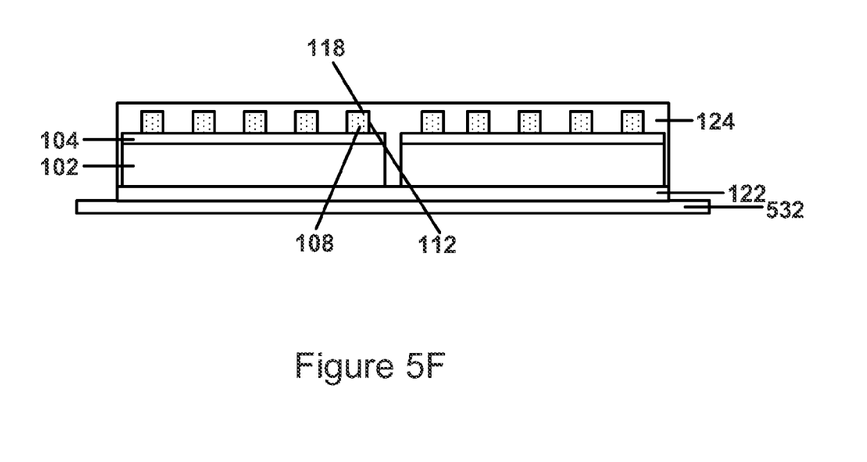

As illustrated in FIG. 5F, the second sheet 124 of the encapsulant material may be formed such that the second ends 118 conductive pillars 108 are no longer exposed. To expose the second ends 118 of the conductive pillars 108, a portion of the second sheet 124 may be removed to expose the second ends 118. In some embodiments, portions of the side surfaces 112 of the conductive pillars 108 may also be exposed, as shown in FIG. 2 or FIG. 3, for example. Removal of the portion of the second sheet 124 may be performed by laser ablation or grinding, or another suitable method. During the operation for removing the portion of the second sheet 124 to expose the second ends 118 of the conductive pillars 108, it may be desirable to remove a small amount of the second ends 118 of the conductive pillars 108 to provide a clean, even surface, but doing so is not required.

Figure 5G:
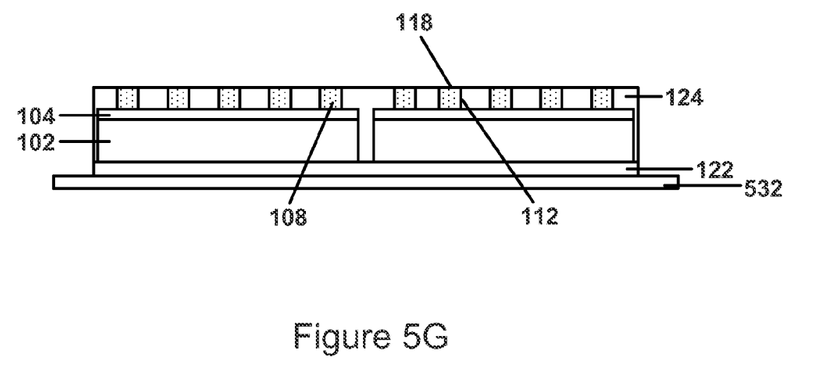

In some embodiments, a thickness of the second sheet 124 of the encapsulant material, when initially formed, may be controlled so that the second ends 118 of the conductive pillars 108 are not covered. For example, the second sheet 124 may be formed so the surface of the second sheet 124 is level with the second ends 118, as shown in FIG. 5G, or below the level of the second ends 118, as shown in FIG. 2.

For embodiments in which the first sheet 122 is a temporary adhesive film, the assembly may be heated above a release temperature of the temporary adhesive film to release the die 102 from the first sheet 122. The second surface 106 of the die 102 may then be covered by an encapsulant material. In various embodiments, the second surface 106 of the die 102 may be covered by a molding material using a suitable method such as, for example, one of those illustrated in FIG. 5D or FIG. 5E. In various embodiments, the second surface 106 of the die 102 may be covered by a wafer-coating resin by screen printing or another suitable operation.

Figure 5H:
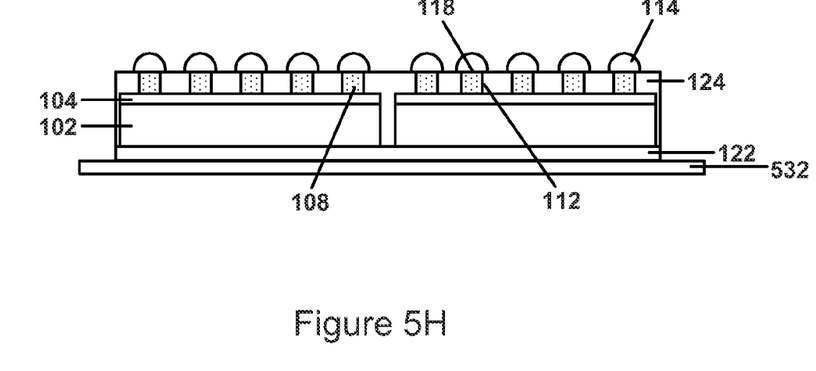

Solder bumps 114 may be directly coupled to the second ends 118 of the conductive pillars 108, as shown in FIG. 5H. For embodiments in which portions of the side surfaces 112 of the conductive pillars 108 are free of the encapsulant material, the solder bumps 114 may also be directly coupled to the side surfaces 112 of the conductive pillars 108, as shown in FIG. 2 and FIG. 3.

A singulation operation may then be performed to separate the devices into individual devices, such as one of the devices 100, 200, or 300 shown in FIG. 1, FIG. 2, or FIG. 3, respectively.

Figure 6:
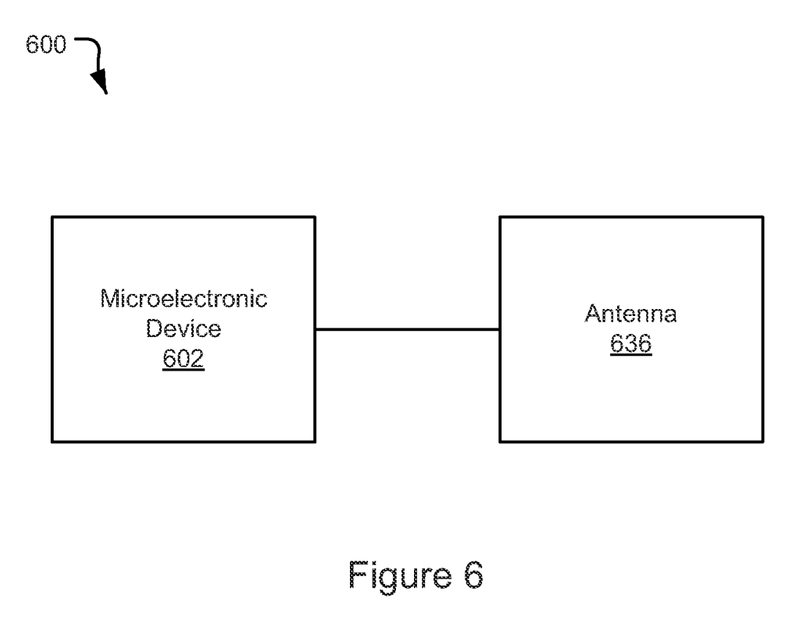
FIG. 6 illustrates a block diagram of a system incorporating a microelectronic device such as, for example, one or more of the devices illustrated in FIGS. 1-4, in accordance with various embodiments of the present invention.

Embodiments of devices described herein, and apparatuses including such devices, may be incorporated into various other apparatuses and systems. A block diagram of an example system 600 is illustrated in FIG. 6. The system 600 may include a microelectronic device 602 and an antenna 636. The device 602 may include, among other things, a die having a first surface and a second surface opposite the first surface, a conductive pillar formed on the first surface of the die, and an encapsulant material encasing the die, including covering the first surface and second surface of the die and at least a portion of a side surface of the conductive pillar. The device 602 may be, for example, a device such as one of devices 100, 200, 300, or 400 as illustrated in FIGS. 1-4, respectively.

In various embodiments, the device 602 may be configured to facilitate transmission and reception of signals, and the antenna 636 may be operatively coupled, but not necessarily directly coupled, to the device 602 to transmit and receive signals.

As the device 602 may have smaller dimensions relative to various related art devices including a carrier substrate, the system may advantageously be incorporated into electronic devices, including mobile phones and other portable electronic devices. The device 602 may, in some embodiments, be modular in configuration such that it includes more than one die, one or more passive components, and possibly one or more other associated components. Although the system may be incorporated into any number of electronic devices, some suitable portable electronic devices may include a laptop computer, a personal digital assistant, a gaming device, a music player, a video player, and the like.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
   a die having a first surface and a second surface opposite the first surface;

a conductive pillar formed on the first surface of the die; and an encapsulant material encasing the die, including covering the first surface, the second surface, and at least a portion of a side surface of the conductive pillar;

wherein the encapsulant material comprises:

a first sheet of the encapsulant material attached to the second surface of the die; and a second sheet of the encapsulant material laminated over the first surface of the die such that the die and the at least the portion of the side surface of the conductive pillar is encased in the encapsulant material.

2. The apparatus of claim 1, wherein a first end of the conductive pillar is directly coupled with the first surface of the die, and wherein a second end of the conductive pillar is free of the encapsulant material.

3. The apparatus of claim 2, further comprising a solder bump directly coupled with the second end of the conductive pillar.

4. The apparatus of claim 2, wherein another portion of the side surface adjacent to the second end of the conductive pillar is free of the encapsulant material.

5. The apparatus of claim 4, wherein a solder bump is directly coupled with the second end of the conductive pillar and the other portion of the side surface of the conductive pillar.

6. The apparatus of claim 1, further comprising a passive component, and wherein the encapsulant material further encases the passive component.

7. The apparatus of claim 1, wherein the encapsulant material comprises a first encapsulant material and a second encapsulant material different from the first encapsulant material, wherein the first surface of the die and the at least the side surface of the conductive pillar is covered by the first encapsulant material, and wherein the second surface of the die is covered by the second encapsulant material.

8. The apparatus of claim 7, wherein the first encapsulant material is a molding material and wherein the second encapsulant material is a wafer-coating resin.

9. A method comprising:

providing a die having a first surface, a second surface opposite the first surface, and a conductive pillar on the first surface of the die; and forming an encapsulant material on the first surface, the second surface, and at least a portion of a side surface of the conductive pillar to encase the die and the conductive pillar;

wherein forming of the encapsulating material comprises:

attaching the second surface of the die to an adhesive material;

covering the first surface of the die with a first encapsulant material such that the die and the at least the portion of the side surface of the conductive pillar is encased in the first encapsulant material;

after the covering, detaching the second surface of the die from the adhesive material; and covering the second surface of the die with a second encapsulant material.

10. The method of claim 9, wherein the providing includes directly coupling a first end of the conductive pillar with the first surface of the die, and wherein the method further comprises directly coupling a solder bump with a second end of the conductive pillar.

11. The method of claim 10, further comprising, before the directly coupling of the solder bump, laser ablating the second end of the conductive pillar to clean the second end of the conductive pillar.

12. The method of claim 10, further comprising, before the directly coupling of the solder bump, removing a portion of the molding material to expose the second end of the conductive pillar.

13. The method of claim 10, further comprising, before the directly coupling of the solder bump, removing a portion of the encapsulant material to expose the second end of the conductive pillar.

14. The method of claim 10, further comprising directly coupling the solder bump with another portion of the side surface of the conductive pillar which is adjacent to the second end of the conductive pillar.

15. The method of claim 9, wherein the first encapsulant material is a molding material and wherein the second encapsulant material is a wafer-coating resin.

16. The method of claim 9, further comprising providing a passive component, and wherein the forming of the encapsulant material includes forming the encapsulant material over the passive component.

17. A system comprising:

a microelectronic device configured to facilitate transmission and reception of signals, the microelectronic device including:

a die having a first surface and a second surface opposite the first surface;

a conductive pillar formed on the first surface of the die; and an encapsulant material encasing the die, including covering the first surface, the second surface, and at least a portion of a side surface of the conductive pillar; and an antenna operatively coupled to the microelectronic device to transmit and receive the signals;

wherein the encapsulant material comprises:

a first sheet of the encapsulant material attached to the second surface of the die; and a second sheet of the encapsulant material laminated over the first surface of the die such that the die and the at least the portion of the side surface of the conductive pillar is encased in the encapsulant material.

18. The system of claim 17, wherein the system is a mobile phone, a smart phone, a laptop computer, a personal digital assistant, a gaming device, a music player, and a video player, a radar device, or a satellite communication device.

* * * * *